(12) United States Patent
Wu

(10) Patent No.: US 11,164,894 B2
(45) Date of Patent: Nov. 2, 2021

(54) DISPLAY PANEL AND MANUFACTURING METHOD THEREOF

(71) Applicant: TCL China Star Optoelectronics Technology Co., Ltd., Guangdong (CN)

(72) Inventor: Huanda Wu, Guangdong (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 41 days.

(21) Appl. No.: 16/626,296

(22) PCT Filed: Nov. 28, 2019

(86) PCT No.: PCT/CN2019/121518
§ 371 (c)(1),
(2) Date: Dec. 23, 2019

(87) PCT Pub. No.: WO2021/072924
PCT Pub. Date: Apr. 22, 2021

(65) Prior Publication Data
US 2021/0118915 A1    Apr. 22, 2021

(30) Foreign Application Priority Data
Oct. 16, 2019    (CN) .......................... 201910983488.7

(51) Int. Cl.
*H01L 27/12*    (2006.01)

(52) U.S. Cl.
CPC ........ *H01L 27/1222* (2013.01); *H01L 27/127* (2013.01); *H01L 27/1251* (2013.01)

(58) Field of Classification Search
None
See application file for complete search history.

(56) References Cited

U.S. PATENT DOCUMENTS

| | | |
|---|---|---|
| 2010/0007836 A1 | 1/2010 | Lee |
| 2012/0182490 A1 | 7/2012 | Kim et al. |
| 2017/0077448 A1* | 3/2017 | Sakamoto ........... H01L 51/5253 |
| 2017/0236884 A1 | 8/2017 | Zhu |
| 2018/0040640 A1* | 2/2018 | Takahashi ........... H01L 27/1222 |

(Continued)

FOREIGN PATENT DOCUMENTS

| | | |
|---|---|---|
| CN | 101625491 A | 1/2010 |
| CN | 102156369 A | 8/2011 |

(Continued)

*Primary Examiner* — Steven M Christopher
(74) *Attorney, Agent, or Firm* — Hamre, Schumann, Mueller & Larson, P.C.

(57) ABSTRACT

The present invention provides a display panel and a manufacturing method thereof. The display panel includes a common electrode layer, a pixel definition layer, a light emitting layer, a transparent pixel electrode layer, and an electrode connecting layer which are sequentially stacked. An electrode connecting portion is formed on the electrode connecting layer and electrically connected with the transparent pixel electrode layer and a signal electrode. Because a common electrode is disposed in a light emitting direction away from the light emitting layer, a light transmittance is not required.

20 Claims, 4 Drawing Sheets

(56) References Cited

U.S. PATENT DOCUMENTS

| | | |
|---|---|---|
| 2018/0090519 A1 | 3/2018 | Park et al. |
| 2018/0097121 A1 | 4/2018 | Fukami et al. |
| 2018/0122298 A1* | 5/2018 | Lee ..................... G09G 3/3233 |

FOREIGN PATENT DOCUMENTS

| | | |
|---|---|---|
| CN | 103268878 A | 8/2013 |
| CN | 105895581 A | 8/2016 |
| CN | 106531764 A | 3/2017 |
| CN | 109638054 A | 4/2019 |

* cited by examiner

DISPLAY PANEL AND MANUFACTURING METHOD THEREOF

This application claims filed Oct. 16, 2019 Chinese Patent Application No. 201910983488.7, entitled "Display panel and manufacturing method thereof" in Chinese Priority Patent Application, the entire content of which is incorporated by reference in the present application.

FIELD OF INVENTION

The present invention relates to the field of displays, in particular to a display panel and a manufacturing method thereof.

BACKGROUND OF INVENTION

At present, common electrodes are made on TFT substrates for top emission pixels, that is, light emitting devices are firstly formed on the TFT substrates, and then the common electrodes are formed. However, this technique requires high resistance and light transmittance of materials of the common electrodes.

Therefore, the prior display panels have technical problems of high requirement on materials of common electrodes, and need to be improved.

Technical Problem

The present invention provides a display panel and a manufacturing method thereof, which are used for relieving technical problems that requirements on materials of common electrodes of current display panels are high.

Technical Solution

To solve the above problems, the present invention provides the following technical solutions:

The present invention provides a display panel comprising:
  a substrate;
  a driving circuit layer disposed on the substrate, wherein the driving circuit layer is patterned to form a signal electrode, and the signal electrode is a source electrode or a drain electrode;
  a planarization layer disposed on the driving circuit layer, wherein the planarization layer is provided with a first via hole at a connection position corresponding to the signal electrode;
  a common electrode layer disposed on the planarization layer, wherein the common electrode layer is provided with a second via hole at a position corresponding to the first via hole;
  a pixel definition layer disposed on the common electrode layer, wherein the pixel definition layer is patterned to form a protruding region, the protruding region is used to define a light emitting region, and the protruding region is provided with a third via hole at a position corresponding to the second via hole;
  a light emitting layer disposed in the light emitting region;
  a transparent pixel electrode layer disposed on the light emitting layer and disposed in the light emitting region, wherein the transparent pixel electrode layer is patterned to form a transparent pixel electrode; and
  an electrode connecting layer comprising an electrode connecting portion, wherein the electrode connecting portion is disposed on the protruding region of the pixel definition layer, passes through the first via hole, the second via hole, and the third via hole, and is electrically connected with the transparent pixel electrode and the signal electrode.

In the display panel provided by the invention, the transparent pixel electrode and the electrode connecting portion are arranged separately or in an integral form.

In the display panel provided by the invention, the transparent pixel electrode is flush with a top surface of the protruding region, and a film section of the electrode connecting portion is laid on a partial region of the transparent pixel electrode and the top surface of the protruding region.

In the display panel provided by the invention, the transparent pixel electrode is lower than a top surface of the protruding region, a film section of the electrode connecting portion is laid on the top surface of the protruding region, and the protruding region corresponds to a slope of the light emitting region and is disposed on a partial region of the transparent pixel electrode.

In the display panel provided by the invention, an aperture of the third via hole is less than an aperture of the second via hole and larger than an aperture of the first via hole, a via hole section of the electrode connecting portion is laid on a slope of the third via hole, a slope of the first via hole, and a buffer contact surface of the pixel definition layer and the planarization layer.

In the display panel provided by the invention, an aperture of the third via hole is less than an aperture of the second via hole and equal to an aperture of the first via hole, and a via hole section of the electrode connecting portion is laid on a slope of the third via hole and a slope of the first via hole.

In the display panel provided by the invention, an aperture of the third via hole is less than an aperture of the second via hole and less than an aperture of the first via hole, and a via hole section of the electrode connecting portion is laid on a slope of the third via hole.

In the display panel provided by the invention, the display panel further comprises an encapsulation layer, wherein the encapsulation layer fills the first via hole, the second via hole, and the third via hole.

In the display panel provided by the invention, the encapsulation layer comprises a first inorganic encapsulation layer, an organic encapsulation layer, and a second inorganic encapsulation layer; the first inorganic encapsulation layer is laid on the light emitting layer and the pixel definition layer, and within the first via hole, the second via hole, and the third via hole; the organic encapsulation layer is disposed on the first inorganic encapsulation layer and fills the first via hole, the second via hole, and the third via hole; the second inorganic encapsulation layer is laid on the organic encapsulation layer.

In the display panel provided by the invention, the driving circuit layer comprises a semiconductor active layer disposed on the substrate, a gate insulating layer disposed on the semiconductor active layer, a gate layer disposed on the gate insulating layer, an interlayer insulating layer covering the gate layer and the semiconductor active layer, and a source-drain layer disposed on the interlayer insulating layer and electrically connected with the semiconductor active layer through the interlayer insulating layer, wherein the source-drain layer comprises the source electrode and the drain electrode.

In the display panel provided by the invention, a material of the planarization layer comprises an inorganic insulating material.

In the display panel provided by the invention, a material of the planarization layer comprises an organic insulating material.

In the display panel provided by the invention, an aperture of the first via hole is gradually increased in a direction away from the driving circuit layer.

In the display panel provided by the invention, a material of the common electrode layer comprises a metal and an alloy thereof.

In the display panel provided by the invention, a material of the common electrode layer comprises aluminum and magnesium aluminum alloy.

In the display panel provided by the invention, a thickness of the common electrode ranges from 50 nm to 500 nm.

In the display panel provided by the invention, a material of the transparent pixel electrode comprises indium tin oxide, indium zinc oxide or a mixture of indium tin oxide and indium zinc oxide.

In the display panel provided by the invention, the electrode connecting layer is made of transparent material.

In the display panel provided by the invention, a material of the electrode connecting layer is the same as that of the transparent pixel electrode layer.

Meanwhile, the present invention further provides a manufacturing method of a display panel, which comprises the following steps:

providing a substrate and forming a driving circuit layer on the substrate; wherein the driving circuit layer is patterned to form a signal electrode, and the signal electrode is a source electrode or a drain electrode;

forming a planarization layer and a common electrode layer on the driving circuit layer in turn; wherein the planarization layer is provided with a first via hole at a connection position corresponding to the signal electrode, and the common electrode layer is provided with a second via hole at a position corresponding to the first via hole;

forming a pixel definition layer on the common electrode layer; wherein the pixel definition layer is patterned to form a protruding region, the protruding region is used to define a light emitting region, and the protruding region is provided with a third via hole at a position corresponding to the second via hole;

forming a light emitting layer; wherein light emitting layer is formed in the light emitting region;

forming a transparent pixel electrode layer; wherein the transparent pixel electrode layer is formed on the light emitting layer and disposed in the light emitting region, and the transparent pixel electrode layer is patterned to form a transparent pixel electrode; and forming an electrode connecting layer; wherein the electrode connecting layer comprises an electrode connecting portion, the electrode connecting portion is formed on the protruding region of the pixel definition layer, passes through the first via hole, the second via hole, and the third via hole, and is electrically connected with the transparent pixel electrode and the signal electrode.

Beneficial Effect

The present invention provides a display panel and a manufacturing method thereof. The display panel includes a substrate, a driving circuit layer, a planarization layer, a common electrode layer, a pixel definition layer, a light emitting layer, a transparent pixel electrode layer, and an electrode connecting layer which are sequentially stacked. An electrode connecting portion is disposed on the electrode connecting layer. The electrode connecting portion is disposed on the protruding region of the pixel definition layer, passes through the first via hole, the second via hole, and the third via hole, and is electrically connected with the transparent pixel electrode and the signal electrode. Because the common electrode is disposed in a light emitting direction away from the light emitting layer, a light transmittance is not required, thereby relieving a technical problem that materials of common electrodes of the current display panel have higher requirements.

DETAILED DESCRIPTION OF PREFERRED EMBODIMENTS

The present invention provides a display panel and a manufacturing method thereof. In order to make the purpose, technical solution, and effect of this invention clearer and more definite, the following describes this application in detail with reference to the drawings and examples. It should be understood that the specific embodiments described herein are only used to explain the application, and are not intended to limit the application.

Directional terms in the present invention, such as upper, lower, left, right, front, back, inner, outer, and lateral side, mentioned in the present invention are only for reference. Therefore, the directional terms are used for describing and understanding rather than limiting the present invention. The terms "first", "second", etc. are used for descriptive purposes only and should not be interpreted as indicating or implying their relative importance or implicitly indicating the number of technical features indicated. Thus, the features defined as "first", "second", etc. may explicitly or implicitly include one or more of the features.

For technical problems that current display panels have high requirements for materials of common electrodes, and the present invention provides a display panel and a manufacturing method thereof to alleviate the problems.

In the embodiment provided by the present invention, the display panel may be a top-gate structure or a bottom-gate structure. In the top gate structure and the bottom gate structure, it may be a top contact structure or a bottom contact structure. In the embodiment of the present invention, we take the bottom gate top contact structure as an example.

Figure 1:
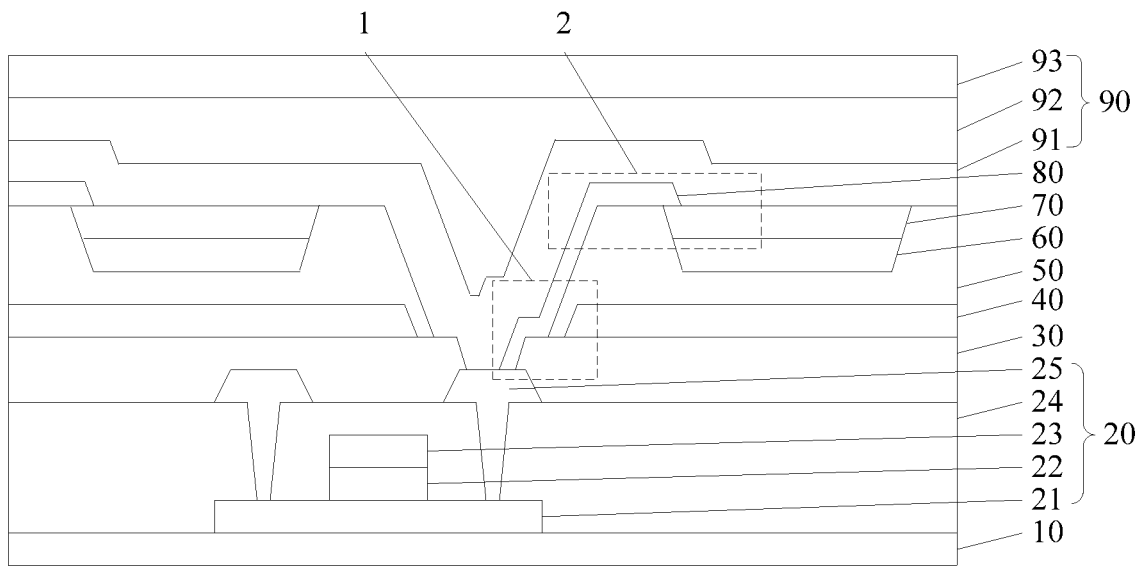
FIG. 1 is a schematic view of a display panel according to an embodiment of the present invention.

In an embodiment, as shown in FIG. 1, the display panel provided in the application comprises:

a substrate 10;

a driving circuit layer 20 disposed on the substrate 10, wherein the driving circuit layer 20 is patterned to form a signal electrode, and the signal electrode is a source electrode or a drain electrode;

a planarization layer 30 disposed on the driving circuit layer 20, wherein the planarization layer 30 is provided with a first via hole at a connection position corresponding to the signal electrode;

a common electrode layer 40 disposed on the planarization layer 30, wherein the common electrode layer 40 is provided with a second via hole at a position corresponding to the first via hole;

a pixel definition layer 50 disposed on the common electrode layer 40, wherein the pixel definition layer 50 is patterned to form a protruding region, the protruding region is used to define a light emitting region, and the protruding region is provided with a third via hole at a position corresponding to the second via hole;

a light emitting layer 60 disposed in the light emitting region;

a transparent pixel electrode layer 70 disposed on the light emitting layer 60 and disposed in the light emitting region, wherein the transparent pixel electrode layer is patterned to form a transparent pixel electrode;

an electrode connecting layer 80 comprising an electrode connecting portion, wherein the electrode connecting portion is disposed on the protruding region of the pixel definition layer 50, passes through the first via hole, the second via hole, and the third via hole, and is electrically connected with the transparent pixel electrode 70 and the signal electrode; and an encapsulation layer 90, wherein the encapsulation layer 90 comprises a first inorganic encapsulation layer 91, an organic encapsulation layer 92, and a second inorganic encapsulation layer 93; the first inorganic encapsulation layer 91 is laid on the light emitting layer 60 and the pixel definition layer 50, and within the first via hole, the second via hole, and the third via hole; the organic encapsulation layer 92 is disposed on the first inorganic encapsulation layer 91 and fills the first via hole, the second via hole, and the third via hole; the second inorganic encapsulation layer 93 is laid on the organic encapsulation layer 92.

The present invention provides a display panel comprising a substrate, a driving circuit layer, a planarization layer, a common electrode layer, a pixel definition layer, a light emitting layer, a transparent pixel electrode layer, and an electrode connecting layer which are sequentially stacked. An electrode connecting portion is disposed on the electrode connecting layer. The electrode connecting portion is disposed on the protruding region of the pixel definition layer, passes through the first via hole, the second via hole, and the third via hole, and is electrically connected with the transparent pixel electrode and the signal electrode. Because the common electrode is disposed in a light emitting direction away from the light emitting layer, a light transmittance is not required, thereby relieving a technical problem that materials of common electrodes of the current display panel have higher requirements.

In an embodiment, the driving circuit layer 20 is formed on the TFT substrate 10, and comprises a semiconductor active layer 21 disposed on the substrate 10, a gate insulating layer 22 disposed on the semiconductor active layer 21, a gate layer 23 disposed on the gate insulating layer 22, an interlayer insulating layer 24 covering the gate layer 23 and the semiconductor active layer 21, and a source-drain layer 25 disposed on the interlayer insulating layer 24 and electrically connected with the semiconductor active layer 21 through the interlayer insulating layer 24, wherein the source-drain layer 25 comprises the source electrode and the drain electrode, and are signal electrodes. In the embodiment provided by the present invention, the signal electrode electrically connected to the transparent pixel electrode through the electrode connecting portion is the source electrode or the drain electrode.

In an embodiment, the planarization layer 30 is disposed on the driving circuit layer 20. Due to an arrangement of components in the driving circuit layer, height parameters of different components are different, which will cause large angular differences in some regions on the driving circuit layer 20, and affect the subsequent display panel process and a final panel display effect. In order to eliminate the angular differences, a planarization layer 30 is formed on the driving circuit layer 20 and used to isolate the driving circuit layer 20 from the common electrode layer 40 on the planarization layer 30. A material of the planarization layer 30 is generally an inorganic insulating material such as silicon dioxide ($SiO_2$), silicon nitride ($Si_3N_4$), aluminum oxide ($Al_2O_3$), or an organic resin or other organic insulating material having certain functional properties.

At the same time, a first via hole is provided on the planarization layer 30 at a connection position corresponding to the signal electrode in the driving circuit layer 20, and an aperture of the first via hole gradually increases in a direction away from the driving circuit layer 20.

In an embodiment, the common electrode layer 40 is formed on the planarization layer 30. Since the common electrode layer 40 is disposed in a direction away from the light emitting layer 50, it is not necessary to consider an influence of its light transmittance. That is, it is not necessary to thin the common electrode layer or select a high-impedance transparent electrode material in order to improve its light transmittance. In order to realize the requirements of the display panel for the high conductivity of the common electrode, the material of the common electrode can be selected from metals and alloy materials with low work function and high electron injection performance, and the metal or metal alloy material is preferably metal aluminum (Al) and magnesium aluminum alloy (Mg/Al). At the same time, since the common electrode layer 40 does not need to be thinned, a thickness of the common electrode layer 40 can be appropriately increased. The larger the thickness, the smaller an impedance of the common electrode layer 40. However, due to panel thicknesses and other restrictions, the thickness of the common electrode layer 40 must be limited to a certain range, and the general setting range is 50 nm to 500 nm. An arrangement of a low work function and high conductivity common electrode layer is conducive to current conduction, thereby improving a display quality of the display panel.

Figure 2:
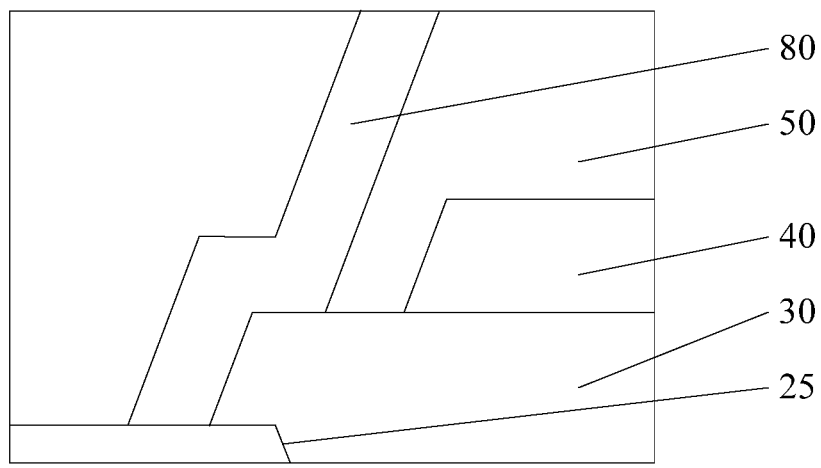
FIG. 2 is a first enlarged schematic view of Region 1 in the embodiment of the present invention.
Figure 3:
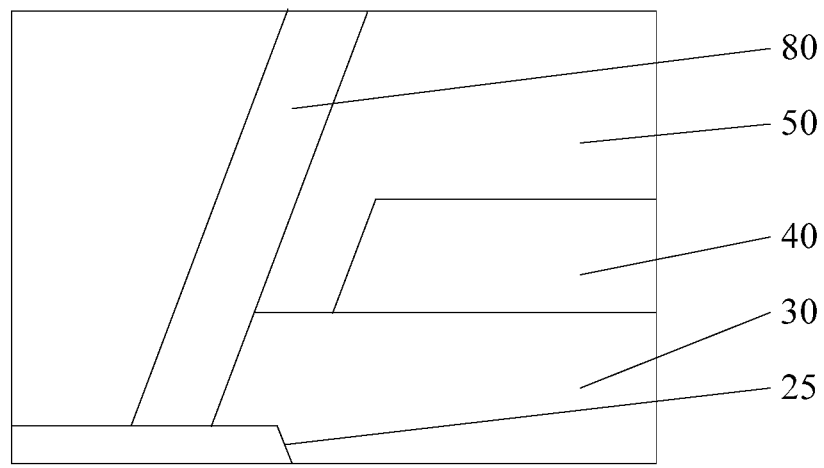
FIG. 3 is a second enlarged schematic view of Region 1 in the embodiment of the present invention.
Figure 4:
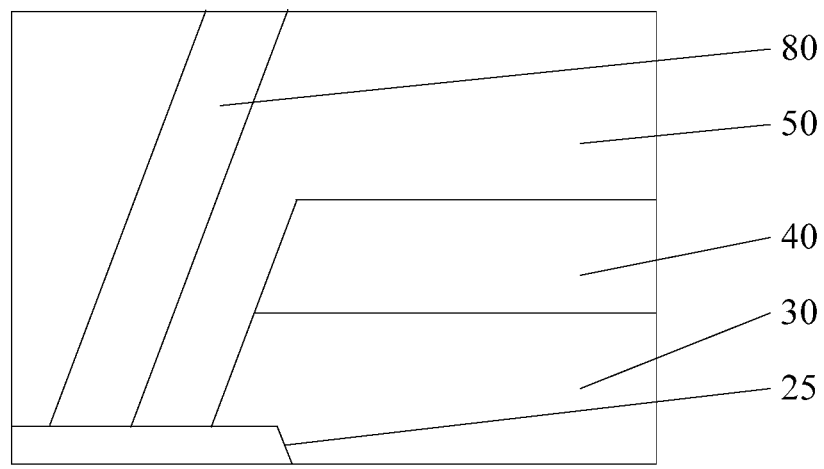
FIG. 4 is a third enlarged schematic view of Region 1 in the embodiment of the present invention.

A second via hole is provided at a position of the common electrode layer 40 corresponding to the first via of the planarization layer 30. As shown in FIG. 2, an aperture of the second via hole is generally larger than an aperture of the first via hole. As shown in FIG. 3 and FIG. 4, the aperture of the second via hole may also be the same as that of the first via hole. The aperture of the second via hole gradually increases in a direction away from the flat planarization 30.

In an embodiment, the pixel definition layer 50 is disposed on the common electrode layer 40, and is patterned to form a protruding region. The protruding region is used to define a light emitting region. The display panel emits light through each sub-pixel, and then emits light on the light-emitting surface to form various colors and corresponding pictures seen by the human eye. In order to meet needs of each sub-pixel to work independently, the light-emitting functional elements of each sub-pixel need to be fixed in a certain position. At the same time, mutual migrations of electrons and holes between adjacent pixels is avoided, so the pixel definition layer is used as a separation between the adjacent sub-pixels of different colors and the adjacent sub-pixels of the same color. That is, the protruding region is patterned on the pixel definition layer, and grooves surrounded by the protruding region is defined as a light emitting region, which is used to accommodate and fix light emitting elements. A material of the pixel definition layer 50 is generally an organic material such as polyimide, acrylic, or phenol resin-based material.

A third via hole is provided at a position of the pixel definition layer 50 corresponding to the second via hole of the common electrode layer 40. As shown in FIG. 2, when the aperture of the second via hole is larger than that of the first via hole, an aperture of the third via hole is less than that of the second via hole and larger than that of the first via hole. As shown in FIG. 3, when the aperture of the second via hole is equal to the aperture of the first via hole, the aperture of the third via hole is equal to the aperture of the second via hole and the aperture of the first via hole. As shown in FIG. 4, when the aperture of the second via hole is equal to the aperture of the first via hole, the aperture of the third via hole is less than the aperture of the second via hole and the aperture of the first via hole.

In an embodiment, the light emitting layer 60 is formed in a light emitting region on the pixel definition layer 50. The light emitting layer 60 may have a dual-film layer structure composed of a unipolar organic material layer and a corresponding transport material layer, may have a three-layer structure composed of a hole transport layer, an electron transport layer, and an organic semiconductor thin film, or may be a multi-layer structure or a stacked string structure. A material of the light emitting layer is mainly a bipolar organic material with a balance of electron and hole mobility combined with a light emitting material.

In an embodiment, the transparent pixel electrode layer 70 is formed on the light emitting layer 60 and is dispose in the light emitting region, and is patterned to form the transparent pixel electrode. The transparent pixel electrode layer 70 is also referred to the anode layer of the display panel. Because the transparent pixel electrode layer 70 is disposed in a light emitting direction of the display panel, a material of the transparent pixel electrode is a transparent material, generally indium tin oxide (ITO), indium zinc oxide (IZO), or a mixture of indium tin oxide and indium zinc oxide. Since the material of the common electrode of the display panel has a high light transmittance, the common electrode layer 70 is disposed on a light emitting side of the display panel on the light emitting layer 60, and can well transmit light emitted by the light emitting layer, which is beneficial to a display effect of the display panel.

Figure 5:
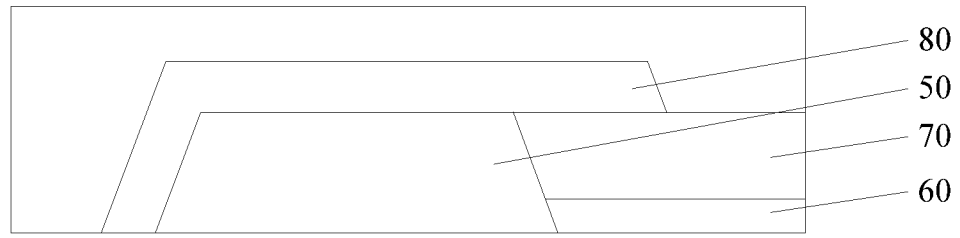
FIG. 5 is a first enlarged schematic view of Region 2 in the embodiment of the present invention.

In an embodiment, as shown in FIG. 5, the transparent pixel electrode is flush with a top surface of the protruding region of the pixel definition layer 50.

Figure 6:
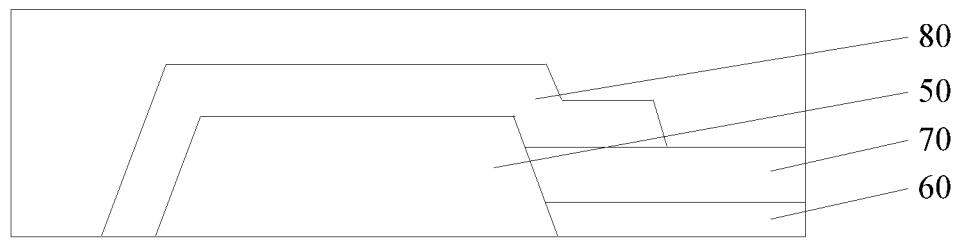
FIG. 6 is a second enlarged schematic view of Region 2 in the embodiment of the present invention.

In another embodiment, as shown in FIG. 6, the transparent pixel electrode is lower than the top surface of the protruding region of the pixel definition layer 50.

In an embodiment, the electrode connecting layer 80 is formed with an electrode connecting portion. The electrode connecting portion is disposed on the protruding region of the pixel definition layer 50, passes through the first via hole, the second via hole, and the third via hole, and is electrically connected with the transparent pixel electrode and the signal electrode. Since the transparent pixel electrode layer 70 is disposed on the light emitting layer 60 and cannot be directly connected to the signal electrode on the driving circuit layer 20, the electrode connecting layer 80 is provided to electrically connect the transparent pixel electrode of the transparent pixel electrode layer 70 and the signal electrode of the common electrode layer 40.

Since the electrode connecting layer 80 is formed on the protruding region of the pixel definition layer 50 and passes through the first via hole, the second via hole and the third via hole, the manner in which the protruding region of the pixel definition layer 50, the first via hole, the second via hole, and the third via hole are arranged affects a formation of the electrode connecting layer.

In an embodiment, as shown in FIG. 2, when the aperture of the third via hole is less than the aperture of the second via hole and larger than the aperture of the first via hole, a via hole section of the electrode connecting portion is laid on a slope of the third via hole, a slope of the first via hole, and a buffer contact surface of the pixel definition layer and the planarization layer. Due to an influence of gravity and a via hole path being too long, an arrangement of the electrode connecting layer 80 in the via hole is likely to form a fault. An arrangement of the via section of the electrode connecting portion on the buffer contact surface of the pixel definition layer and the planarization layer divides the slope of the via hole into two sections, and a platform-type buffer surface is used as a transition in the middle, which can effectively relieve the electrode connecting layer 80, which can effectively alleviate a stress effect of the electrode connecting layer 80 during a formation process, and is beneficial to the electrode connecting layer 80 to form a continuous and uniform structure.

In an embodiment, as shown in FIG. 3, the aperture of the third via hole is less than the aperture of the second via hole and equal to the aperture of the first via hole, and the via hole section of the electrode connecting portion is laid on the slope of the third via hole and the slope of the first via hole.

In another embodiment, as shown in FIG. 4. the aperture of the third via hole is less than the aperture of the second via hole and less than the aperture of the first via hole, and the via hole section of the electrode connecting portion is laid on the slope of the third via hole.

In another embodiment, as shown in FIG. 6, the transparent pixel electrode is lower than a top surface of the protruding region of the pixel definition layer 50. A film section of the electrode connecting portion is laid on the top surface of the protruding region, and the protruding region corresponds to the slope of the light emitting region and is disposed on a partial region of the transparent pixel electrode.

A material of the electrode connecting layer 80 may be a transparent material or a non-transparent material, and is preferably transparent indium tin oxide (ITO), indium zinc oxide (IZO), or a mixture of indium tin oxide and indium zinc oxide.

In an embodiment, the material of the electrode connecting layer 80 is the same as that of the transparent pixel electrode layer 70, which may be one of the same transparent indium tin oxide (ITO), indium zinc oxide (IZO), or a mixture of indium tin oxide and indium zinc oxide. Since the material of the electrode connecting layer 80 is the same as that of the transparent pixel electrode layer 70, the electrode connecting layer 80 and the transparent pixel electrode layer 70 may be formed separately by using the same or different technical means, or may be integrally formed by one means.

In an embodiment, the electrode connecting layer 80 and the transparent pixel electrode layer 70 are arranged separately. That is, the transparent pixel electrode layer 70 is first formed on the light emitting layer 60, and then on the protruding region of the pixel definition layer 50 and a partial region of the transparent pixel electrode, and in the first via hole, the second via hole, and the third via hole to form the electrode connecting layer 80 and ensure that the electrode connecting layer 80 is in contact with the transparent pixel electrode and the signal electrode, respectively. A formation of the electrode connecting layer 80 and the transparent pixel electrode layer 70 can be achieved by means of vacuum evaporation. After the transparent pixel electrode layer 70 is evaporated, the vacuum connection is performed by a second vacuum evaporation device to obtain the electrode connecting layer 80. The formation of the electrode connecting layer 80 and the transparent pixel electrode layer 70 can also be achieved by means of inkjet printing. After printing the transparent pixel electrode layer 70 on the light emitting layer 60, translate the printing device or reset the printing position and range and perform secondary printing to obtain the electrode connecting layer 80. It can also be obtained by other preparation processes.

The separate arrangement of the electrode connecting layer 80 and the transparent pixel electrode layer 70 has simple requirements on the device, and only needs to modulate the device after the transparent pixel electrode layer 70 is formed and before the electrode connecting layer 80 is formed. At the same time, the separate arrangement can also be used when forming the electrode connecting layer 80 and the transparent pixel electrode layer 70, which is not limited to the same preparation method, and a more suitable manufacturing method is selected separately.

In the embodiment, the material of the electrode connecting layer 80 and the material of the transparent pixel electrode layer 70 may be the same, which are both one of transparent indium tin oxide (ITO), indium zinc oxide (IZO), or a mixture of indium tin oxide and indium zinc oxide. The material of the electrode connecting layer 80 and the material of the transparent pixel electrode layer 70 may also be different, which are two different kinds of transparent indium tin oxide (ITO), indium zinc oxide (IZO), or a mixture of indium tin oxide and indium zinc oxide.

In another embodiment, the electrode connecting layer 80 and the transparent pixel electrode layer 70 are in an integral form. That is, a conductive layer is formed on the protruding region of the light emitting layer 60 and the pixel definition layer 50, and is formed in the first via hole, the second via hole, and the third via hole at the same time by using the same technical means. A portion disposed on the light emitting layer 60 realizes a role of the transparent pixel electrode layer 70, a portion disposed on the protruding region of the pixel definition layer 50, and a portion disposed inside the first via hole, the second via hole, and the third via hole realize a role of the electrode connecting layer 80. The conductive layer can be realized by technical means such as vacuum evaporation and inkjet printing. The electrode connecting layer 80 and the transparent pixel electrode layer 70 provided in the integral form is a is simple manufacturing process. Only one manufacturing method is used for a process, and the electrode connecting layer 80 and the transparent pixel electrode layer 70 are integrally and continuously arranged without interruption of the same material, and their connection performance and conductivity are the best.

The encapsulation layer 90 comprises the first inorganic encapsulation layer 91, the organic encapsulation layer 92, and the second inorganic encapsulation layer 93. The first inorganic encapsulation layer 91 is laid on the light emitting layer 60 and the pixel definition layer 50, and within the first via hole, the second via hole, and the third via hole. The organic encapsulation layer 92 is disposed on the first inorganic encapsulation layer 91 and fills the first via hole, the second via hole, and the third via hole. The second inorganic encapsulation layer 93 is laid on the organic encapsulation layer 92. The first inorganic encapsulation layer 91 and the second inorganic encapsulation layer 93 are used to isolate water vapor and oxygen outside the display panel, thereby protecting the display panel. The organic encapsulation layer 92 for stress relief and planarization. Materials of the first inorganic encapsulation layer 91 and the second inorganic encapsulation layer 93 may be the same or different, which are silicon oxide, silicon nitride, and silicon oxynitride. The inorganic encapsulation layer can be formed by chemical vapor deposition (CVD), physical vapor deposition (PVD), or atomic layer deposition (ALD). A material of the organic encapsulation layer 92 is any one of acrylic, epoxy, or silicone materials. The organic encapsulation layer 92 can be formed by coating on the first inorganic encapsulation layer 91 by any of inkjet printing, spray coating, and coating processes.

At the same time, an embodiment of the present invention further provides a display device comprising a display panel. As shown in FIG. 1, the display panel comprises:

a substrate 10;

a driving circuit layer 20 disposed on the substrate 10, wherein the driving circuit layer 20 is patterned to form a signal electrode, and the signal electrode is a source electrode or a drain electrode;

a planarization layer 30 disposed on the driving circuit layer 20, wherein the planarization layer 30 is provided with a first via hole at a connection position corresponding to the signal electrode;

a common electrode layer 40 disposed on the planarization layer 30, wherein the common electrode layer 40 is provided with a second via hole at a position corresponding to the first via hole;

a pixel definition layer 50 disposed on the common electrode layer 40, wherein the pixel definition layer 50 is patterned to form a protruding region, the protruding region is used to define a light emitting region, and the protruding region is provided with a third via hole at a position corresponding to the second via hole;

a light emitting layer 60 disposed in the light emitting region;

a transparent pixel electrode layer 70 disposed on the light emitting layer 60 and disposed in the light emitting region, wherein the transparent pixel electrode layer is patterned to form a transparent pixel electrode;

an electrode connecting layer 80 comprising an electrode connecting portion, wherein the electrode connecting portion is disposed on the protruding region of the pixel definition layer 50, passes through the first via hole, the second via hole, and the third via hole, and is electrically connected with the transparent pixel electrode 70 and the signal electrode; and an encapsulation layer 90, wherein the encapsulation layer 90 comprises a first inorganic encapsulation layer 91, an organic encapsulation layer 92, and a second inorganic encapsulation layer 93; the first inorganic encapsulation layer 91 is laid on the light emitting layer 60 and the pixel definition layer 50, and within the first via hole, the second via hole, and the third via hole; the organic encapsulation layer 92 is disposed on the first inorganic encapsulation layer 91 and fills the first via hole, the second via hole, and the third via hole; the second inorganic encapsulation layer 93 is laid on the organic encapsulation layer 92.

In an embodiment, the transparent pixel electrode and the electrode connecting portion are arranged separately or in an integral form.

In an embodiment, the transparent pixel electrode is flush with a top surface of the protruding region, and a film section of the electrode connecting portion is laid on a partial region of the transparent pixel electrode and the top surface of the protruding region.

In an embodiment, the transparent pixel electrode is lower than a top surface of the protruding region, a film section of the electrode connecting portion is laid on the top surface of the protruding region, and the protruding region corresponds to a slope of the light emitting region and is disposed on a partial region of the transparent pixel electrode.

In an embodiment, an aperture of the third via hole is less than an aperture of the second via hole and larger than an aperture of the first via hole, a via hole section of the electrode connecting portion is laid on a slope of the third via hole, a slope of the first via hole, and a buffer contact surface of the pixel definition layer and the planarization layer.

In an embodiment, an aperture of the third via hole is less than an aperture of the second via hole and equal to an aperture of the first via hole, and a via hole section of the electrode connecting portion is laid on a slope of the third via hole and a slope of the first via hole.

In an embodiment, an aperture of the third via hole is less than an aperture of the second via hole and less than an aperture of the first via hole, and a via hole section of the electrode connecting portion is laid on a slope of the third via hole.

In an embodiment, the display panel further comprises an encapsulation layer, wherein the encapsulation layer fills the first via hole, the second via hole, and the third via hole.

In an embodiment, the encapsulation layer comprises a first inorganic encapsulation layer, an organic encapsulation layer, and a second inorganic encapsulation layer; the first inorganic encapsulation layer is laid on the light emitting layer and the pixel definition layer, and within the first via hole, the second via hole, and the third via hole; the organic encapsulation layer is disposed on the first inorganic encapsulation layer and fills the first via hole, the second via hole, and the third via hole; the second inorganic encapsulation layer is laid on the organic encapsulation layer.

The working principle of the display device provided in the invention is similar to the above-mentioned display panel. For details, reference may be made to the foregoing embodiments, and details are not described herein again.

The present invention provides a display device comprising a display panel. The display panel includes a substrate, a driving circuit layer, a planarization layer, a common electrode layer, a pixel definition layer, a light emitting layer, a transparent pixel electrode layer, and an electrode connecting layer which are sequentially stacked. An electrode connecting portion is disposed on the electrode connecting layer. The electrode connecting portion is disposed on the protruding region of the pixel definition layer, passes through the first via hole, the second via hole, and the third via hole, and is electrically connected with the transparent pixel electrode and the signal electrode. Because the common electrode is disposed in a light emitting direction away from the light emitting layer, a light transmittance is not required, thereby relieving a technical problem that materials of common electrodes of the current display panel have higher requirements.

Figure 7:
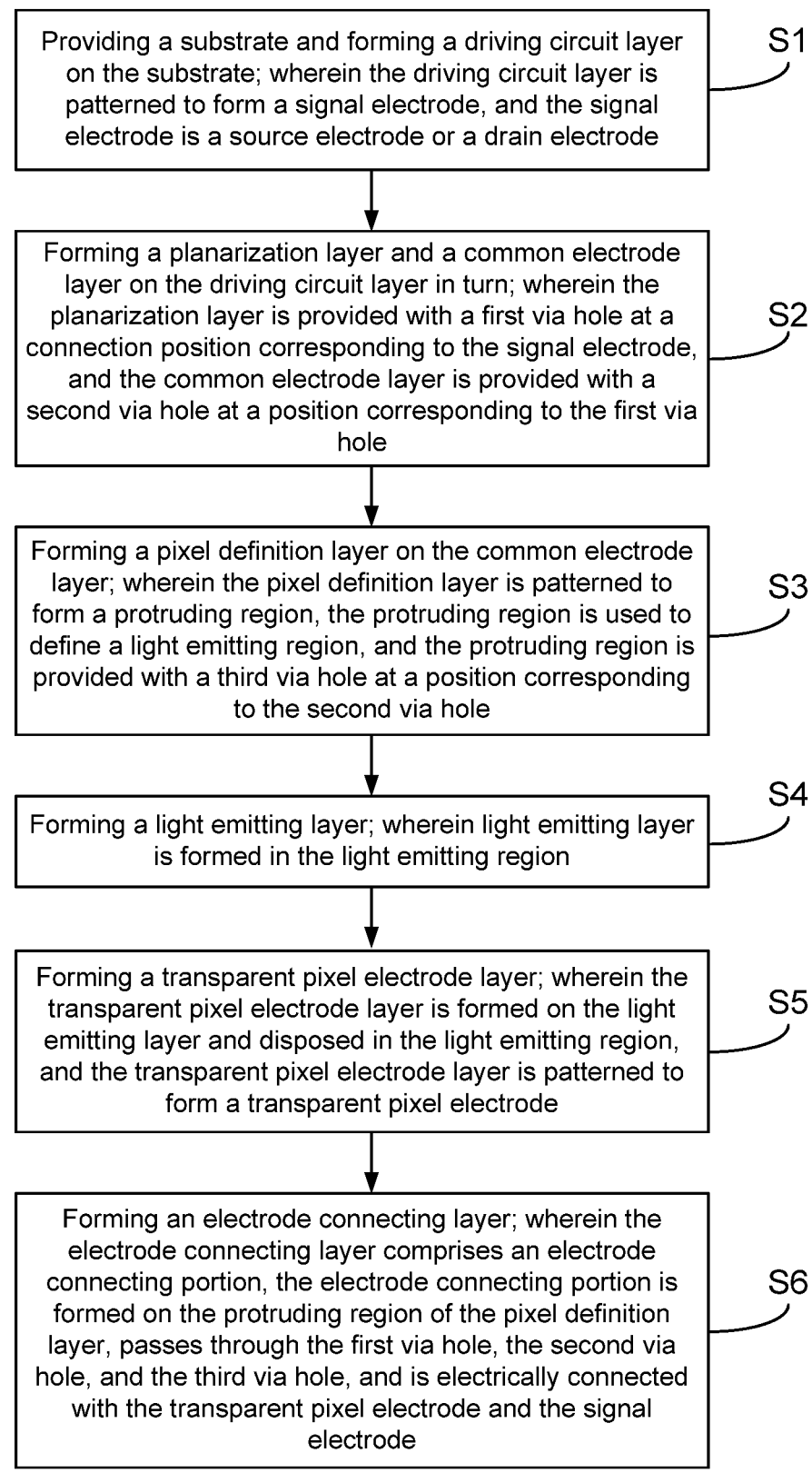
FIG. 7 is a schematic view of a process for manufacturing a display panel according to the embodiment of the present invention.

The present invention further providing a manufacturing method of a display panel. As shown in FIG. 7, which comprises the following steps:

S1: providing a substrate and forming a driving circuit layer on the substrate; wherein the driving circuit layer is patterned to form a signal electrode, and the signal electrode is a source electrode or a drain electrode;

S2: forming a planarization layer and a common electrode layer on the driving circuit layer in turn; wherein the planarization layer is provided with a first via hole at a connection position corresponding to the signal electrode, and the common electrode layer is provided with a second via hole at a position corresponding to the first via hole;

S3: forming a pixel definition layer on the common electrode layer; wherein the pixel definition layer is patterned to form a protruding region, the protruding region is used to define a light emitting region, and the protruding region is provided with a third via hole at a position corresponding to the second via hole;

S4: forming a light emitting layer; wherein light emitting layer is formed in the light emitting region;

S5: forming a transparent pixel electrode layer; wherein the transparent pixel electrode layer is formed on the light emitting layer and disposed in the light emitting region, and the transparent pixel electrode layer is patterned to form a transparent pixel electrode; and S6: forming an electrode connecting layer; wherein the electrode connecting layer comprises an electrode connecting portion, the electrode connecting portion is formed on the protruding region of the pixel definition layer, passes through the first via hole, the second via hole, and the third via hole, and is electrically connected with the transparent pixel electrode and the signal electrode.

An embodiment of the present invention providing the manufacturing method of the display panel, which comprises the following steps: providing a substrate and forming a driving circuit layer on the substrate; wherein the driving circuit layer is patterned to form a signal electrode, and the signal electrode is a source electrode or a drain electrode; forming a planarization layer and a common electrode layer on the driving circuit layer in turn; wherein the planarization layer is provided with a first via hole at a connection position corresponding to the signal electrode, and the common electrode layer is provided with a second via hole at a position corresponding to the first via hole; forming a pixel definition layer on the common electrode layer; wherein the pixel definition layer is patterned to form a protruding region, the protruding region is used to define a light emitting region, and the protruding region is provided with a third via hole at a position corresponding to the second via hole; forming a light emitting layer; wherein light emitting layer is formed in the light emitting region; forming a transparent pixel electrode layer; wherein the transparent pixel electrode layer is formed on the light emitting layer and disposed in the light emitting region, and the transparent pixel electrode layer is patterned to form a transparent pixel electrode; and forming an electrode connecting layer; wherein the electrode connecting layer comprises an electrode connecting portion, the electrode connecting portion is formed on the protruding region of the pixel definition layer, passes through the first via hole, the second via hole, and the third via hole, and is electrically connected with the transparent pixel electrode and the signal electrode. Because the common electrode is disposed in a light emitting direction away from the light emitting layer, a light transmittance is not required, thereby relieving a technical problem that materials of common electrodes of the current display panel have higher requirements.

In an embodiment, when the electrode connecting layer 80 and the transparent pixel electrode layer 70 are provided separately, the specific manufacturing method includes: First, the transparent pixel electrode layer 70 is formed on the light emitting layer 60, and then the electrode connecting layer 80 is formed on the protruding region of the pixel definition layer 50, and is formed within the first via hole, the second via hole and the third via hole, and ensures that the electrode connecting layer 80 is in contact with the transparent pixel electrode and the signal electrode, respectively.

In an embodiment, a vacuum evaporation apparatus is used. An organic light emitting layer is vapor-deposited in the light emitting region of the pixel definition layer 50, and then an evaporation material is replaced with a transparent pixel electrode material, and then a transparent pixel electrode layer 70 is vapor-deposited above the light-emitting layer 60. When the material of the electrode connecting layer 80 is the same as that of the transparent pixel electrode layer 70, an evaporation source is translated so that a position of the evaporation source corresponds to the first via hole, the second via hole, the third via hole, the protruding region of the pixel definition layer 50, the partial region of the transparent pixel electrode, and the partial region of the signal electrode. An electrode connecting layer 80 is obtained by re-evaporating the display panel, and the electrode connecting layer 80 is electrically connected to the transparent pixel electrode and the signal electrode. When the material of the electrode connecting layer 80 is different from the material of the transparent pixel electrode layer 70, the evaporation material in the evaporation source is replaced with the material of the electrode connecting layer 80, and perform the same steps as above. When re-evaporating the display panel, in order to ensure the connection performance of the electrode connecting layer, the evaporation time can be appropriately extended.

The embodiment adopts a set of evaporation device and mask plate, and adopts a simple way of translating the evaporation source and changing the evaporation material to realize the forming of three film layers of a light emitting layer, a transparent pixel electrode layer, and an electrode connection layer, All of them are formed in a vacuum evaporation chamber, which ensures the cleanness of a preparation environment and a control of a state of a preparation substrate. The manufacturing method described in the embodiment has a single setting requirement, a simple manufacturing process, and strong operability, which is conducive to forming a clean and high-performance display panel having the split electrode connecting layer 80 and the transparent pixel electrode layer 70.

In another embodiment, the separate preparation of the electrode connecting layer 80 and the transparent pixel electrode layer 70 may also use a set of inkjet printing equipment. By replacing the print cartridges with different film materials and setting the printing parameters, the three film layers of the light emitting layer, the transparent pixel electrode layer, and the electrode connection layer can be formed.

In another embodiment, the separate preparation of the transparent pixel electrode layer 70 and the electrode connecting layer 80 may also be formed by using different processing methods and in different equipment, as long as the manufacturing method and means that can meet the requirements of the embodiments of the present invention are all protected by the present invention.

In an embodiment, the conductive film layer is prepared by using an inkjet printing process. Setting the print region within the protruding region of the light emitting layer 60, the pixel definition layer 50, the first via hole, the second via hole, the third via hole, and some signal electrodes that are in continuous contact. Print on the print region using a print cartridge with a conductive film. In the embodiment, the preparation of the transparent pixel electrode layer 70 and the electrode connecting layer 80 can be completed in one printing, the setting requirements are single, the preparation process is simple, the operation is convenient, and the inkjet printing controls the setting range of the film layer accurately. The integrated arrangement is more beneficial to the electrical connection between the transparent pixel electrode layer 70 and the electrode connecting layer 80.

In another embodiment, a vacuum evaporation process is used to form a mask covering the protruding regions of the light emitting layer 60, the pixel definition layer 50, the first via hole, the second via hole, the third via hole, and a continuous contact range of some signal electrodes. The preparation of the transparent pixel electrode layer 70 and the electrode connecting layer 80 can be completed by one evaporation process. The steps are simple, the operation is convenient, and the integrated setting is more conducive to the electrical connection between the transparent pixel electrode layer 70 and the electrode connecting layer 80.

In another embodiment, the transparent pixel electrode layer 70 and the electrode connecting layer 80 may also be formed by using a spin coating method, a spray coating method, or other process means.

According to the above embodiment, it can be known that:

The present invention provides a display panel and a manufacturing method thereof. The display panel includes a substrate, a driving circuit layer, a planarization layer, a common electrode layer, a pixel definition layer, a light emitting layer, a transparent pixel electrode layer, and an electrode connecting layer which are sequentially stacked. An electrode connecting portion is disposed on the electrode connecting layer. The electrode connecting portion is disposed on the protruding region of the pixel definition layer, passes through the first via hole, the second via hole, and the third via hole, and is electrically connected with the transparent pixel electrode and the signal electrode. Because the common electrode is disposed in a light emitting direction away from the light emitting layer, a light transmittance is not required, thereby relieving a technical problem that materials of common electrodes of the current display panel have higher requirements.

In the above, various other corresponding changes and modifications can be made according to the technical solutions and technical ideas of the present invention to those skilled in the art, and all such changes and modifications are within the scope of the claims of the present invention.

What is claimed is:

1. A display panel, comprising:
   a substrate;
   a driving circuit layer disposed on the substrate, wherein the driving circuit layer is patterned to form a signal electrode, and the signal electrode is a source electrode or a drain electrode;
   a planarization layer disposed on the driving circuit layer, wherein the planarization layer is provided with a first via hole at a connection position corresponding to the signal electrode;

a common electrode layer disposed on the planarization layer, wherein the common electrode layer is provided with a second via hole at a position corresponding to the first via hole;

a pixel definition layer disposed on the common electrode layer, wherein the pixel definition layer is patterned to form a protruding region, the protruding region is used to define a light emitting region, and the protruding region is provided with a third via hole at a position corresponding to the second via hole;

a light emitting layer disposed in the light emitting region;

a transparent pixel electrode layer disposed on the light emitting layer and disposed in the light emitting region, wherein the transparent pixel electrode layer is patterned to form a transparent pixel electrode portion, the transparent pixel electrode portion is lower than a top surface of the protruding region, a film section of the electrode connecting portion is laid on the top surface of the protruding region, and the protruding region is arranged corresponding to a slope of the light emitting region and is partially arranged on the transparent pixel electrode portion; and an electrode connecting layer comprising an electrode connecting portion, wherein the electrode connecting portion is disposed on the protruding region of the pixel definition layer, passes through the first via hole, the second via hole, and the third via hole, and is electrically connected with the transparent pixel electrode portion and the signal electrode.

2. The display panel as claimed in claim 1, wherein the transparent pixel electrode portion and the electrode connecting portion are arranged separately or in an integral form.

3. The display panel as claimed in claim 1, wherein the transparent pixel electrode is flush with a top surface of the protruding region, and a film section of the electrode connecting portion is partially laid on the transparent pixel electrode portion and the top surface of the protruding region.

4. The display panel as claimed in claim 1, wherein an aperture of the third via hole is less than an aperture of the second via hole and larger than an aperture of the first via hole, a via hole section of the electrode connecting portion is laid on a slope of the third via hole, a slope of the first via hole, and a buffer contact surface of the pixel definition layer and the planarization layer.

5. The display panel as claimed in claim 1, wherein an aperture of the third via hole is less than an aperture of the second via hole and equal to an aperture of the first via hole, and a via hole section of the electrode connecting portion is laid on a slope of the third via hole and a slope of the first via hole.

6. The display panel as claimed in claim 1, wherein an aperture of the third via hole is less than an aperture of the second via hole and less than an aperture of the first via hole, and a via hole section of the electrode connecting portion is laid on a slope of the third via hole.

7. The display panel as claimed in claim 1, further comprising an encapsulation layer, wherein the encapsulation layer fills the first via hole, the second via hole, and the third via hole.

8. The display panel as claimed in claim 7, wherein the encapsulation layer comprises a first inorganic encapsulation layer, an organic encapsulation layer, and a second inorganic encapsulation layer; the first inorganic encapsulation layer is laid on the light emitting layer and the pixel definition layer, and within the first via hole, the second via hole, and the third via hole; the organic encapsulation layer is disposed on the first inorganic encapsulation layer and fills the first via hole, the second via hole, and the third via hole; the second inorganic encapsulation layer is laid on the organic encapsulation layer.

9. The display panel as claimed in claim 1, wherein the driving circuit layer comprises a semiconductor active layer disposed on the substrate, a gate insulating layer disposed on the semiconductor active layer, a gate layer disposed on the gate insulating layer, an interlayer insulating layer covering the gate layer and the semiconductor active layer, and a source-drain layer disposed on the interlayer insulating layer and electrically connected with the semiconductor active layer through the interlayer insulating layer, wherein the source-drain layer comprises the source electrode and the drain electrode.

10. The display panel as claimed in claim 1, wherein a material of the planarization layer comprises an inorganic insulating material.

11. The display panel as claimed in claim 1, wherein a material of the planarization layer comprises an organic insulating material.

12. The display panel as claimed in claim 1, wherein an aperture of the first via hole is gradually increased in a direction away from the driving circuit layer.

13. The display panel as claimed in claim 1, wherein a material of the common electrode layer comprises a metal and an alloy thereof.

14. The display panel as claimed in claim 13, wherein a material of the common electrode layer comprises aluminum and magnesium aluminum alloy.

15. The display panel as claimed in claim 1, wherein a thickness of the common electrode ranges from 50 nm to 500 nm.

16. The display panel as claimed in claim 1, wherein a material of the transparent pixel electrode portion comprises indium tin oxide, indium zinc oxide or a mixture of indium tin oxide and indium zinc oxide.

17. The display panel as claimed in claim 1, wherein the electrode connecting layer is made of transparent material.

18. The display panel as claimed in claim 1, wherein a material of the electrode connecting layer is the same as that of the transparent pixel electrode layer.

19. A manufacturing method of a display panel, comprising following steps of:

providing a substrate and forming a driving circuit layer on the substrate, wherein the driving circuit layer is patterned to form a signal electrode, and the signal electrode is a source electrode or a drain electrode;

forming a planarization layer and a common electrode layer on the driving circuit layer in turn, wherein the planarization layer is provided with a first via hole at a connection position corresponding to the signal electrode, and the common electrode layer is provided with a second via hole at a position corresponding to the first via hole;

forming a pixel definition layer on the common electrode layer, wherein the pixel definition layer is patterned to form a protruding region, the protruding region is used to define a light emitting region, and the protruding region is provided with a third via hole at a position corresponding to the second via hole;

forming a light emitting layer, wherein light emitting layer is formed in the light emitting region;

forming a transparent pixel electrode layer wherein the transparent pixel electrode layer is formed on the light emitting layer and disposed in the light emitting region, the transparent pixel electrode layer is patterned to form a transparent pixel electrode portion, and the transparent pixel electrode portion is flush with a top surface of the protruding region, or the transparent pixel electrode portion is lower than a top surface of the protruding region; and forming an electrode connecting layer, wherein the electrode connecting layer comprises an electrode connecting portion, the electrode connecting portion is formed on the protruding region of the pixel definition layer, passes through the first via hole, the second via hole, and the third via hole, and is electrically connected with the transparent pixel electrode portion and the signal electrode.

20. A display panel, comprising:

a substrate;

a driving circuit layer disposed on the substrate, wherein the driving circuit layer is patterned to form a signal electrode, and the signal electrode is a source electrode or a drain electrode;

a planarization layer disposed on the driving circuit layer, wherein the planarization layer is provided with a first via hole at a connection position corresponding to the signal electrode;

a common electrode layer disposed on the planarization layer, wherein the common electrode layer is provided with a second via hole at a position corresponding to the first via hole;

a pixel definition layer disposed on the common electrode layer, wherein the pixel definition layer is patterned to form a protruding region, the protruding region is used to define a light emitting region, and the protruding region is provided with a third via hole at a position corresponding to the second via hole;

a light emitting layer disposed in the light emitting region;

an encapsulation layer filling the first via hole, the second via hole, and the third via hole, wherein the encapsulation layer comprises a first inorganic encapsulation layer, an organic encapsulation layer, and a second inorganic encapsulation layer; the first inorganic encapsulation layer is laid on the light emitting layer and the pixel definition layer, and within the first via hole, the second via hole, and the third via hole, the organic encapsulation layer is disposed on the first inorganic encapsulation layer and fills the first via hole, the second via hole, and the third via hole; and the second inorganic encapsulation layer is laid on the organic encapsulation layer;

a transparent pixel electrode layer disposed on the light emitting layer and disposed in the light emitting region, wherein the transparent pixel electrode layer is patterned to form a transparent pixel electrode portion; and an electrode connecting layer comprising an electrode connecting portion, wherein the electrode connecting portion is disposed on the protruding region of the pixel definition layer, passes through the first via hole, the second via hole, and the third via hole, and is electrically connected to the transparent pixel electrode portion and the signal electrode.

* * * * *